United States Patent [19]
Samuel

[11] 3,935,568
[45] Jan. 27, 1976

[54] UNIVERSAL ANALOG-TO-DIGITAL CONVERTER USING THE SAME INFORMATION DISC FOR DIFFERENT OUTPUT CODES

[75] Inventor: Joseph Samuel, Westbury, N.Y.

[73] Assignee: Lem Instrument Corporation, Framingdale, N.Y.

[22] Filed: Mar. 28, 1973

[21] Appl. No.: 345,692

Related U.S. Application Data

[63] Continuation of Ser. No. 201,964, Nov. 24, 1971, which is a continuation of Ser. No. 863,244, Oct. 2, 1969, abandoned.

[52] U.S. Cl. .................. 340/347 P; 250/231 SE
[51] Int. Cl. .................. G08c 9/08; H03k 13/02
[58] Field of Search ............ 340/347 P, 190; 250/231 SE

[56] References Cited
UNITED STATES PATENTS

3,022,500  2/1962  Stupar ........................ 340/347 P
3,246,316  4/1966  Saylor et al. .................. 340/347 P

*Primary Examiner*—Thomas J. Sloyan
*Attorney, Agent, or Firm*—James E. Nilles

[57] ABSTRACT

A device for converting mechanical positions into an electric signal output. The device includes a position indicator track having a plurality of segments representing mechanical positions. A signal means is coupled to the elements whose mechanical position is to be converted and provides an energizing signal to the position indicator track responsive to the mechanical positioning of the elements. Signal forming means are connected to the position indicator track for generating an output signal indicative of the mechanical position of the elements.

2 Claims, 10 Drawing Figures

3,935,568

UNIVERSAL ANALOG-TO-DIGITAL CONVERTER USING THE SAME INFORMATION DISC FOR DIFFERENT OUTPUT CODES

This is a continuation, of application Ser. No. 201,964 filed Nov. 24, 1971 which was a continuation of application Ser. No. 863,244 filed Oct. 2, 1969, now abandoned.

BACKGROUND OF THE INVENTION — FIELD OF THE INVENTION

The present invention relates to devices for converting or transforming physical phenomena, such as relative mechanical motion between two elements, into an electric signal output suitable for control or other purposes. Such devices are often termed analog to digital converters. A common form of such converting apparatus is used to provide an electric signal output responsive to the rotary position of a shaft and is termed a shaft encoder.

BACKGROUND OF THE INVENTION — DESCRIPTION OF THE PRIOR ART

The transformation of physical phenomena into corresponding electrical signals is necessary in order to provide to control means, as for example, digital computers, input signals in a usable form. In a typical application, it may be desired to provide to a computer a signal indicative of the rotary position of a shaft. For this purpose, a converting apparatus having a mechanical input connected to the shaft and an electrical signal output connected to the computer is utilized.

In operation, the converting apparatus provides to the computer an electrical output which has predetermined unique signal characteristics for each discrete rotary position of the shaft. If the rotary position of the shaft is sensed in ten degree intervals, a unique output signal corresponding to each 10° interval, e.g. 0° through 9°, 10° through 19°, etc. will be provided to the computer. The output signal is provided continuously, but changes in characteristic at the termination of one 10° interval and the beginning of the next 10° interval.

To obtain the desired signal characteristics in the converting device output, the output signal must generally be in digital rather than analog form. Such a digital output signal is commonly obtained by utilizing the presence and absence of electric signals at the output terminals of the converting apparatus to represent the digits of the output signal. This type of digital output signal is often termed a "binary encoded" signal and its signal characteristics termed the "counts" of the converting apparatus.

Converting devices, such as binary shaft encoders have, in the past, typically been formed with a rotating encoder disc having a plurality of annular tracks. Generally, one such track is provided for each digit appearing in the encoder output signal. For example, in the case given above, wherein shaft position is sensed in ten degree intervals, the encoder disc must have at least six tracks to provide the requisite signal characteristics to an output signal encoded in binary coded decimal form.

Each annular track consists of electrically conductive and non-conductive areas arranged to represent the output signal digit formed by the particular track so that the geometric pattern of the encoder disc tracks is a graphical representation of the electrical output of the encoder. Brushes are placed in contact with the tracks to engage the conductive and non-conductive track areas as the shaft rotates. Electric current flows through the brushes whenever a conductive area passes under the brushes. Electrical signals are taken from the brushes, generally through electric signal circuitry, and are provided to the output terminals of the converting apparatus to form the coded digital output signal.

Such prior art binary encoding devices have suffered two general failings which have led to the development of the improved converting device of the present invention. These shortcomings of the prior art may be generally summarized as an inflexibility in operation, specifically in signal generation, and a complexity of construction.

Considering initially the matter of inflexibility of signal generation, it must be appreciated, that numerous code forms may be used to provide the above described unique signal characteristics to the converting device output. In addition to the binary coded decimal form already mentioned, binary encoded output signals may be formed in the straight binary code, the Gray code, the excess of six code, the excess of three code, and others. As the geometric pattern of conductive and non-conductive segments on the encoder disc in prior art shaft encoders controlled the generation of the encoded electrical output signal, it was difficult, if not impossible, to change the code form of the output signal without changing the encoder disc. Thus, in the past, each code form has required an encoding disc specifically designed for that form and disassembly of the encoder, replacement of the disc, as well as associated electronic circuitry, and reassembly of the encoder in order to change the code form. Even with replaceable code discs, prior art shaft encoders were limited to the types of code forms which could be generated.

Further, in the use of common binary code forms, prior art shaft encoders were restricted in the signal characteristics, or counts, which could be generated. Such prior art shaft encoders were generally limited to the generation of a single signal characteristic type in which, for example, the total count provided per revolution formed a power of two, or a multiple of ten, or a multiple of 36. A prior art encoder designed for one type of signal characteristic could not be used for the generation of other types nor could any of the prior art encoders generate a count of 106 per revolution in a facile manner, the latter number not being a power of 2, multiple of 10, or multiple of 36, etc.

With regard to the construction of such devices, as a separate track has been required for each digit appearing in the output signal, the encoder disc has tended to be complex and large in physical size in order to accommodate the requisite number of tracks. As the accuracy of mechanical motion measurement, i.e., resolution of the encoder, increased, the complexity of the encoder disc was correspondingly increased. For example, if it was desired to ascertain shaft position in one degree intervals, rather than in ten degree intervals, as in the example above, the encoder disc had to have ten tracks rather than six. The size of the encoder disc had to be correspondingly enlarged or additional encoder discs employed.

The large number of tracks found in prior art shaft encoders necessitated a large number of brushes. In order to insure accurate and non-ambiguous formation of the electrical output signal, a plurality of brushes were provided on each track. The plurality of brushes rendered more complex the electrical circuitry associated with the brushes and used to generate the encoder output signal. The alignment of the many brushes used in such encoders, both among themselves, and with respect to the pattern of the tracks on the encoder discs, was difficult to establish and even more difficult to maintain for any substantial operating period.

In addition to the above faults, prior art shaft encoders suffered from a large inertia of the moving parts, considerable output signal noise, and other failings.

SUMMARY OF THE PRESENT INVENTION

In contrast to the above described prior art encoding apparatus, the present invention provides a converting device which is both flexible in operation and simple in construction.

The converting device of the present invention may provide an output signal having a wide variety of signal characteristic forms without replacement or alteration of the encoder disc or brush structure portions thereof. Further, the output signal characteristics form may be changed without the replacement or the alteration of the encoder disc or brush structure.

The flexibility of the converting device of the present invention may be further emphasized by noting that, not only can output signals having a wide variety of signal characteristic forms be generated, but also output signals having a desired function with respect to the physical phenomena being sensed may be formed. In the typical case in which the converting device is utilized as a shaft position encoder, an encoded output signal which is the sine of the angular position, or the logarithm of the sine of the angular position may be formed. Similarly, an output signal having an arbitrary function with respect to angular position may be generated. For example, signal characteristics of the output signal of the encoder may correspond in some linear manner to the angular position of the shaft up to a preselected angular position and thereafter remain unchanged for all other angular positions. All this may be accomplished without altering the encoding disc pattern or brush configuration of the converting device.

In addition to providing complete flexibility in the code form and signal function generated, the converting device is not limited to signal characteristics which are powers of two, multiples of ten and the like. Thus, the converting device of the present invention may provide an electrical output having one hundred and six counts per revolution of the shaft.

The converting device of the present invention provides an electrical output which is inherently non-ambiguous and in which the digits of the output signal are presented simultaneously and continuously for all mechanical positions of the elements.

The simplicity obtained by the converting device of the present invention resides in the fact that only two tracks of conductive and non-conductive areas are required for providing any desired code form, signal characterisitc, or signal function to the output signal. Additionally, the brush structure and associated energizing circuitry of the present invention is considerably simpler than that encountered in prior art encoding apparatus and remains unchanged regardless of code form, signal characteristics, or signal function of the output signal.

The simplicity of the converting device facilitates the construction of high resolution devices having pluralities of track pairs in cascaded form.

The present invention also provides a converting device which has a low inertia in the moving parts, a very low noise level in the output signal, and which possesses great reliability and ease of assembly and maintenance.

Briefly, the present invention provides a device for converting discrete mechanical positions existing between two elements into an electrical output having a preselected electric signal for each discrete mechanical position. A position indicator means having a plurality of electrically energizable indicator portions is provided in the device. Each of the indicator portions represents at least one of the mechanical positions to which the elements may be displaced.

A signal means is coupled to the elements for applying, responsive to the displacement of the elements, an energizing electric signal to the portion of the position indicator means corresponding to the mechanical position to which the elements have been displaced.

A signal forming means is connected to the position indicator means for generating the preselected output signal from the energization of the position indicator means.

DESCRIPTION OF THE PREFERRED EMBODIMENT

Introduction

Figure 1:
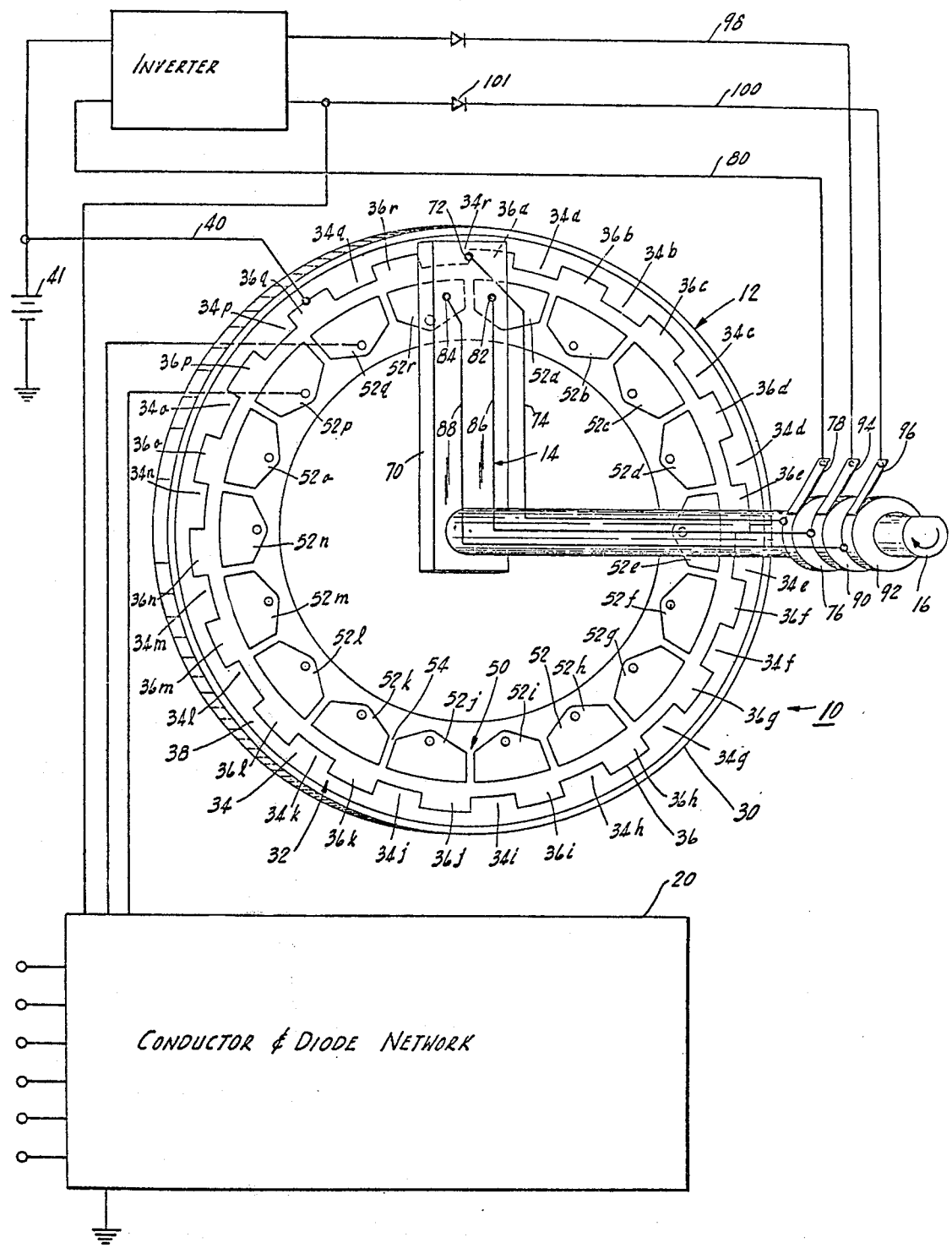
FIG. 1 is a general view of the converting device of the present invention, with certain elements thereof shown in perspective and with other elements shown in block diagram form.

The converting or encoding device of the present invention is shown in FIG. 1 by the numeral 10. The device is shown and described herein as a shaft position encoder which provides an encoded output signal indicative of the angular position of the shaft element with respect to another, generally stationary element. However, it is to be understood that the apparatus may be used to transform or convert other types of mechanical positioning, as for example, the relative rectilinear positioning of two elements.

Encoder 10 includes an encoding disc 12 and a brush assembly or structure 14 cooperable with a pair of tracks located on the encoder disc. One of the aforesaid elements is stationary while the other is responsive to the movement of shaft 16, the angular position of which is to be encoded. FIG. 1 show, in exemplary form, brush assembly 14 mounted on shaft 16 for movement therewith while encoder disc 12 is stationary, although it will be appreciated that the stationary brush assembly-rotating disc configuration may be used if desired. It will also be understood that a surrounding housing is provided for encoding device 10 which is not shown in FIG. 1 in order to facilitate the showing of the details of the present invention. The housing includes bearings for journalling shaft 16 and the appropriate mounting for stationary encoder disc 12.

Converting device 10 indicates angular positions in predetermined discrete angular or arcuate intervals. For example, the encoder may sense angular positions in terms of ten degree position intervals. Thus, one preselected electric signal is generated when the shaft is at angles of from zero up to, but not including, 10°. When the shaft moves to an angle of 10°, another, different, preselected electric signal is generated. This electric signal exists for shaft angles of from 10° up to 20°, and so on. As used herein, the term "position" thus means the angular or arcuate interval discriminated by the converting device and generally not a single angular position or angle.

However, it will be appreciated that converting device 10 may be constructed so that the position interval sensed is of any desired magnitude within the capabilities of manufacturing processes. For example, the converting device may be constructed to sense position intervals of one degree, one second, or portions thereof, so that the position interval sensed by the converting device may approach and take on the characteristics of a single angular position or angle. The ability of the converting device to discriminate angular position is termed its "resolution" and the smaller the interval, the higher the resolution.

Also, the term "discrete" is used herein in the sense of distinct, rather than discontinuous, since as explained, infra, an electric signal is continuously generated at the output of the device. However, the characteristic of the signal changes when the shaft attains an angle of ten degrees, twenty degrees, etc.

For exemplary purposes, converting device 10 is shown and described herein as providing an output which is encoded in a binary decimal code form in which counts of ten are given recognition in a manner resembling that of the decimal system. The output is provided at a plurality of output terminals of the converting device and is indicated by a preselected combination of the presence or absence of electrical signals at the output terminals. The code is established by assigning each output terminal or binary digit, a weighted decimal value. In the exemplary embodiment of the invention shown in FIG. 1, the output terminals are assigned the decimal values 1, 2, 4, 8, 10, and 20. The converting device output signal is formed by providing an electrical signal to selected ones of the output terminals and is interpreted by summing the decimal values assigned to each of the energized output terminals to arrive at an output signal count. It will be appreciated that numerous other code forms can be utilized and that other decimal equivalents may be assigned to the output terminals.

In addition to the aforesaid encoding disc 12 and brush assembly 14, converting device 10 of the present invention includes a signal inverting means, shown as inverter 18, which controls the energization of the brushes in the brush assembly in a manner hereinafter described and a signal forming means which contains the aforementioned output terminals of converting device 10. The signal forming means is comprised of a conductor and diode network 20 which is connected to the encoding disc and which forms the encoded output signal of converting device 10. These elements are described in detail below.

THE ENCODING DISC

Encoding disc 12 may be formed of a base member 30 of electrically non-conductive material, such as a plastic sheeting. A pair of annular tracks are positioned on base member 30 as shown in FIG. 1, by plating, printing, or otherwise depositing electrically conductive material in the desired pattern on the base member. The annular tracks shown in FIG. 1 are illustrated in a developed, linear form in FIG. 2.

A first annular track 50 is included in converting device 10. This track may hereinafter be called the position indicator track or means, as it provides a means by which the mechanical position of shaft 16 may be sensed. While proper operation of converting device 10 requires only that position indicator track 50 be mounted in a fixed locational relationship to second track 32 hereinafter described, it is preferable to mount track 50 coaxially and adjacent to track 32, as shown in FIG. 1 and as shown, in developed form, in FIG. 2.

Position indicator track 50 is comprised of a plurality of contiguous, electrically conductive segments 52. While contiguous, segments 52 are separated from each other by insulating spaces or barriers 54 so that the segments are electrically independent. Each segment 52 of position indicator track 50 represents one or more angular positions of shaft 16. In generic terms, one segment 52 must be provided in track 50 for each shaft position to be indicated by the converting device. In the generic embodiment of converting device 10, shown in FIG. 1, shaft positions will be sensed at 20° intervals by the eighteen track segments 52a through 52r in track 50.

However, it may be noted in passing that, in the linear encoder species of the generic device described and claimed herein, in which the electrical output count bears a direct or linear relationship to shaft position, each segment may represent two shaft positions rather than one. Thus, the resolution of a linear encoder is twice that of a similarly constructed encoder in which the output is a function, such as the sine, of angular position. If converting device 10 shown in FIG. 1 is used as a linear encoder, shaft positions will be sensed at ten degree intervals.

One or more conductors connect each of the segments 52 of position indicator track 50 to conductor and diode network 20.

Second track 32 is formed of a plurality of pairs of conductive elements 34 and non-conductive interelement spaces 36. The arcuate distance occupied by each element-space pair is equal to the arcuate dimension occupied by one of the conductive segments 52 plus the adjacent portions of insulating barriers 54 on either side of the segment. Thus, eighteen such pairs are provided containing conductive elements 34a through 34r and interelement spaces 36a through 36r. Conductive elements 34a through 34r are electrically connected together by conductor 38 extending along one edge of the track and are energized by an electric signal provided by conductor 40 from an electrical power source shown as battery 41.

While it is desirable to locate each of the element-space pairs in alignment with a corresponding segment 52 of track 50, as shown in the FIGURES, this is not necessary, as long as the fixed locational relationship between track 32 and position indicator track 50 is maintained.

Track 32 provides a means by which the absolute position of shaft 16, as sensed by position indicator track 50, is ascertained in an unambiguous manner by controlling the energization of the brushes in brush assembly 14.

While encoder disc 12 is shown in circular plate form in FIG. 1, it will be appreciated that it may take other forms, such as that of a drum, or, in cases in which rectilinear position is to be sensed, a strip. Further, while the tracks 32 and 50 on encoder disc 12 are shown as formed of electrically conductive materials, they may be formed for coaction with optical, magnetic, or other sensory devices.

THE BRUSH ASSEMBLY

Brush assembly 14 may include a bar-like frame member 70 which is affixed to shaft 16 so as to assume the same angular position as the shaft.

A first brush means, comprised of a pair of brushes 82 and 84, is carried by the frame member 70 for wiping engagement with the conductive segments 52 of position indicator track 50 as the rotary position of shaft 16 is altered. Brushes 82 and 84 are alternately energized to apply a signal to one, and only one, of segments 52 of position indicator track 50 for any given position of shaft 16. The application of signal to segments 52 thus provides a signal condition in converting device 10 which is directly responsive to the angular position of shaft 16. The ability of converting device 10 to provide such exclusive segment signal application may hereinafter be referred to as lending the property of non-ambiguity to the device, since through such application an electric signal is formed which admits of no uncertainty as to shaft position.

In view of the precedence of brush 82 in engaging the conductive segments when the rotary position of the shaft is altered in the direction shown by the arrow in FIG. 1, as described infra, under Operation, brush 82 is termed the lead brush herein. Brush 84 is correspondingly termed the lag brush. As shown most clearly in FIG. 2, brushes 82 and 84 are generally aligned and spaced apart in a direction along the length of position indicator track 50 a predetermined distance, approximately one-half the length of, or arcuate distance occupied by, one of segments 52. Brushes 82 and 84 are connected to conductors 86 and 88 and collector rings 90 and 92, respectively. Collector rings 90 and 92 engage brushes 94 and 96 for supplying the signals from inverter 18 in conductors 98 and 100 to brushes 82 and 84 and segments 52 of position indicator track 50. It will be appreciated that while collector rings are shown in surrounding shaft 16 in FIG. 1, they may take the form of annular bands on encoder disc 12 which are engaged by additional collector ring brushes on frame member 70.

A second contacting electrical brush 72 is provided in frame member 70 for engaging conductive elements 34 and non-conductive spaces 36 as the rotary position of shaft 16 is altered. When so drawn around track 32 by shaft 16, brush 72 is alternately electrically energized, when in contact with conductive areas 34a through 34r, and de-energized when in contact with non-conductive spaces 36a through 36r. The electrical signals generated in brush 72 by its engagement with track 32 are provided through conductor 74, collector ring 76, and brush 78 to conductor 80 for controlling the operation of inverter 18 and the supply of signals to lead-lag brushes 82 and 84. Such signal supply is generally termed in the art, lead-lag selection.

It is desirable to locate brushes 82 and 84 with respect to brush 72 on frame member 70 so that an imaginary perpendicular containing brush 72 intersects an imaginary line connecting the aligned brushes 82 and 84 and preferably so that the imaginary perpendicular containing brush 72 bisects an imaginary line connecting aligned brushes 82 and 84. However, it will be appreciated that other brush configurations may be devised which will provide the signal supply to brushes 82 and 84 necessary to obtain the desired lead-lag selection.

The use of only three brushes in converting device 10 permits the construction of a low inertia brush assembly 14 with its attendant advantages.

SIGNAL INVERTING MEANS

The signal inverting means of converting device 10 is interposed between brush 72 and lead lag brushes 82 and 84 for energizing the latter pair of brushes responsive to the electric signal state of brush 72. For this purpose, conductor 80 containing the electric signal in brush 72 is connected to the input terminal of signal inverting means 18. The signal inverting means may include one or more inverting amplifiers and may hereinafter be referred to as a dual inverter. Dual inverter 18 provides a pair of mutually exclusive, output signals. One such signal is provided in conductor 98 to lead brush 82 while the other is provided in conductor 100 to lag brush 84. The operation of dual inverter 18 is such that it provides an output signal in one of conductors 98 or 100 to the exclusion of a signal in the other of its outputs in response to presence of an input signal in conductor 80 and provides an output signal in the other of conductors 100 or 98 in response to the absence of an input signal in conductor 80. Dual inverter 18 also serves to prevent electrical signal noise generated by brush 72 in conductor 80 from appearing in the output of converting device 10.

Dual inverter 18 is comprised of a pair of interconnected inverting transistors 102 and 104. See FIG. 2. The base of transistor 102 forms the input of dual inverter 18 and is connected to conductor 80 through resistor 106. The emitters of transistor 102 and 104 are connected in parallel to common bus 108. The collectors of transistors 102 and 104 are connected in parallel to voltage supply conductor 109 connected to battery 41. Resistors 110 and 112 are interposed between supply conductor 109 and the collectors of the transistors. The base of transistor 104 is connected to the collector of transistor 102 through resistor 114. The bases of transistors 102 and 104 are connected to common conductor 108 through resistors 116 and 118, respectively. One output signal of dual inverter 18 is taken from the collector of transistor 102 by conductor 98 while the other output signal is taken from the collector of transistor 104 by conductor 100. Conductors 98 and 100 contain isolation diodes 99 and 101.

THE CONDUCTOR AND DIODE NETWORK

Conductor and diode network 20 connects segments 52 of position indicator track 50 to the output terminals of device 10 for converting the position indicator track electric signal condition formed responsive to the angular position of shaft 16 into an output signal of the desired form.

As noted supra, the output terminals of converting device 10 are assigned weighted decimal values of 1, 2, 4, 8, 10, and 20. It will be appreciated that these weighted values may be sealed downward or upward, if desired, so that the weighted decimal values of the output terminals are, for example, .1, .2, .4, .8, 1.0, and 2.0 or 10, 20, 40, 80, and 100 and 200.

Figure 2:
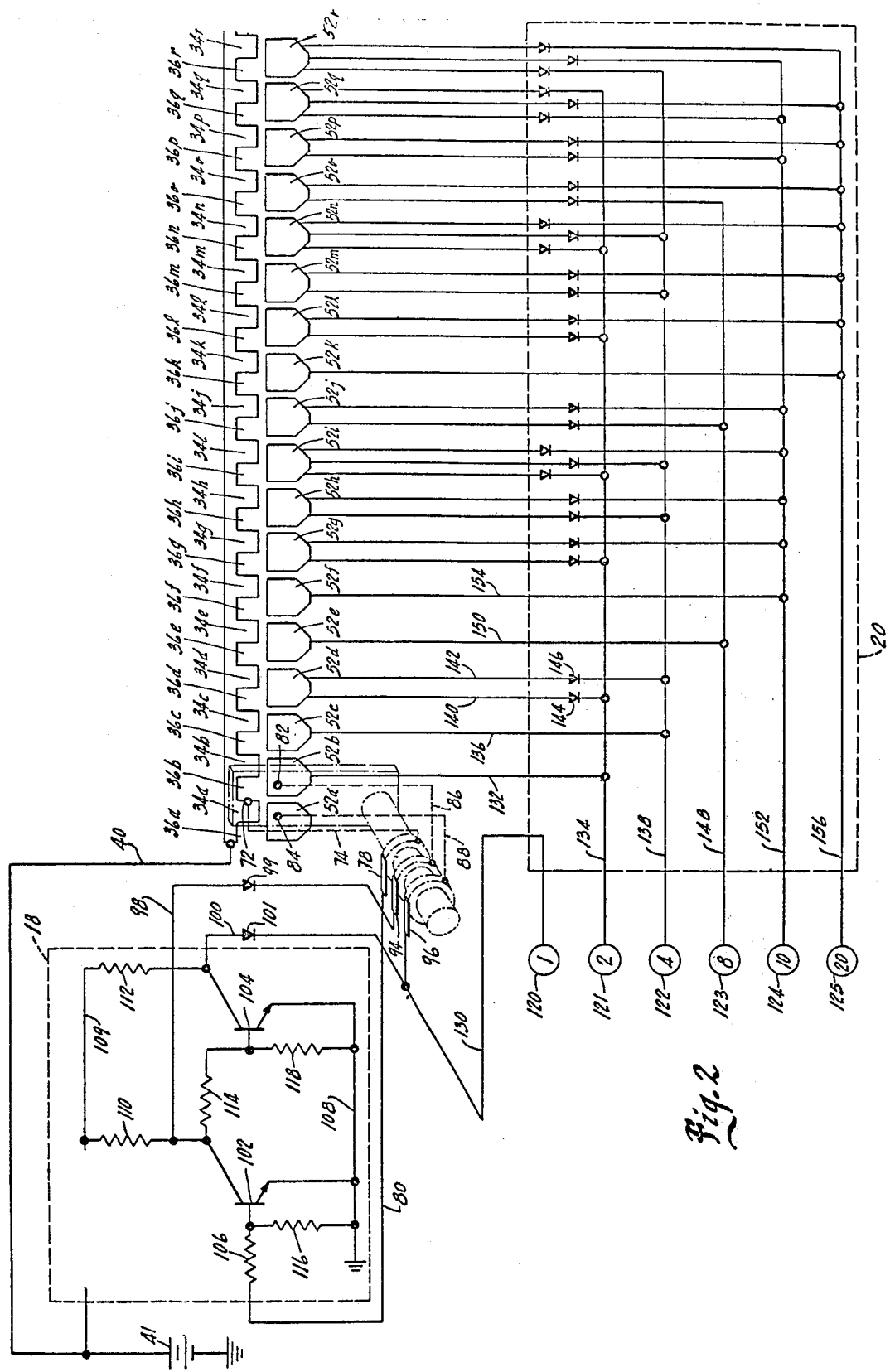
FIG. 2 is a schematic representation of the converting device shown in FIG. 1. The figure is a developed view in that certain portions of the device shown therein, which are physically arranged in circular form in the device as shown in FIG. 1, have been developed into a linear form to facilitate an explanation and understanding on the invention. The figure also shows, in detail, the elements shown in block diagram form in FIG. 1 and the interconnection of the various elements of the converting device.
Figure 5:
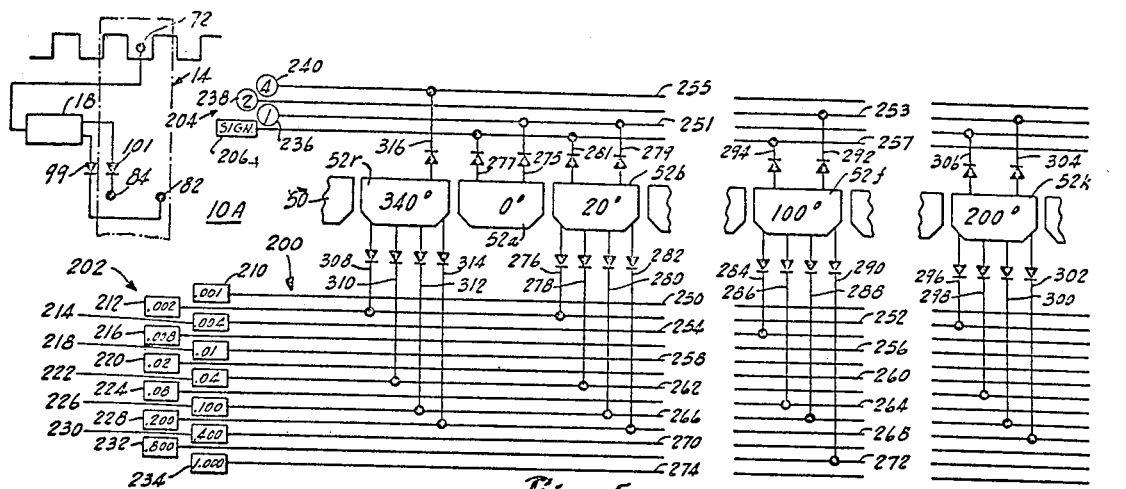
FIG. 5 is a further fragmentary schematic view showing a modification of the converting device shown in FIGS. 1 through 3 suitable for the generation of a function type of output signal.

The interconnection of segments 52 of position indicator track 50 to the output terminals of converting device 10 controls the relationship between changes in the electric output of the converting device and changes in angular position of shaft 16. This relationship has heretofore been termed the "function" of the output signal. For purposes of explanation, encoders generating two different types of functions are shown and described herein. FIGS. 2 and 3 show a linear encoder in which the electric output signal characteristic, or count, bears a direct or linear relationship to the shaft position. This linear converting device is described immediately below. FIG. 5 shows a converting device having an electric output corresponding to the sine of shaft angular position and is further described under Other Embodiments.

Turning now to FIGS. 2 and 3, the converting device 10 shown therein has a conductor and diode network 20 containing six output terminals, 120 through 125, at which digit signals in the form of the presence or absence of electrical signals may appear to form the binary encoded output of the converting device. Output terminals 120 through 125 are assigned the weighted decimal values 1, 2, 4, 8, 10 and 20, respectively, as noted on the FIGURES. As shaft 16 is rotated from a position of zero degrees to a position of 350°, decimal equivalent output signals having characteristics or counts from zero to 35 will be provided at the output terminals.

Output terminal 120 is connected to conductor 100, and the signal applied to lag brush 84 by inverter 18, by conductor 130 so that one output signal of inverter 18 is applied directly to that terminal. This connection accounts for the increased resolution of a linear encoder, as noted supra. The first indicator track segment 52a is isolated and is not connected to conductor and diode network 20.

Conductor 132 connects second segment 52b to bus 134 connected to output terminal 121. Conductor 136 connects third segment 52c to bus 138 connected to output terminal 122. Segment 52d is connected to bus 134 and output terminal 121 by conductor 140 and to bus 138 and output terminal 131 by conductor 142. Diodes 144 and 146 are inserted in conductors 140 and 142 to insure proper signal isolation. For example, diode 144 in conductor 140 prevents a signal in conductor 132 from being transmitted to position indicator track segment 52d via bus 134 and conductor 140.

Track segment 52e is connected to bus 148 connected to output terminal 123 by conductor 150. Segment 52f is connected to bus 152 and output terminal 124 by conductor 154. This completes the conductor connections necessary to establish the first ten output signals of the converting device which are used to explain its operation, infra.

The remaining position indicator track segments 52g through 52r are connected in a generally analagous manner to the output terminals, with the exception that each of position indicator track segments 52g through 52j are connected to a conductor connected to bus 152 which provides the decimal ten signal to output terminal 124 of the encoding device and each of position indicator track segments 521 through 52r are connected to a conductor connected to bus 156 which provides the decimal twenty signal to output terminal 125 of converting device 10.

OPERATION

Figure 3A:
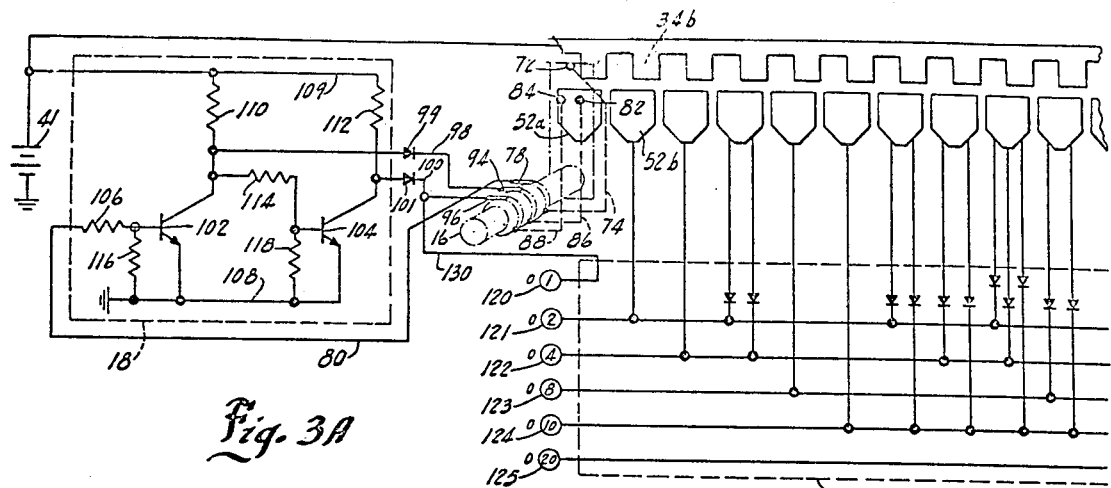
FIGS. 3a through 3e are a series of fragmentary schematic views of the device in the same developed form utilized for FIG. 2, showing the operation of the device.
Figure 3B:
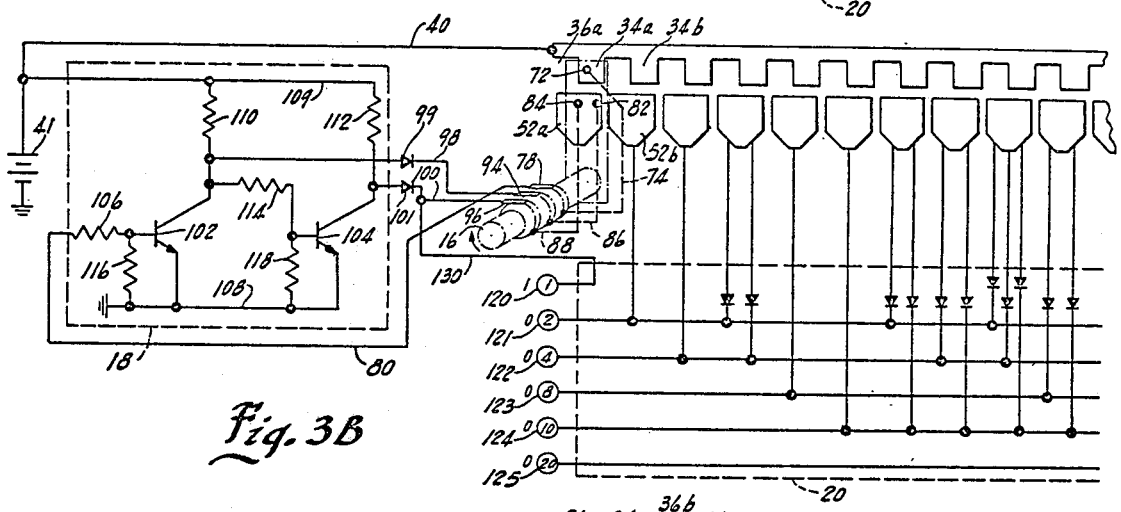
Figure 3C:
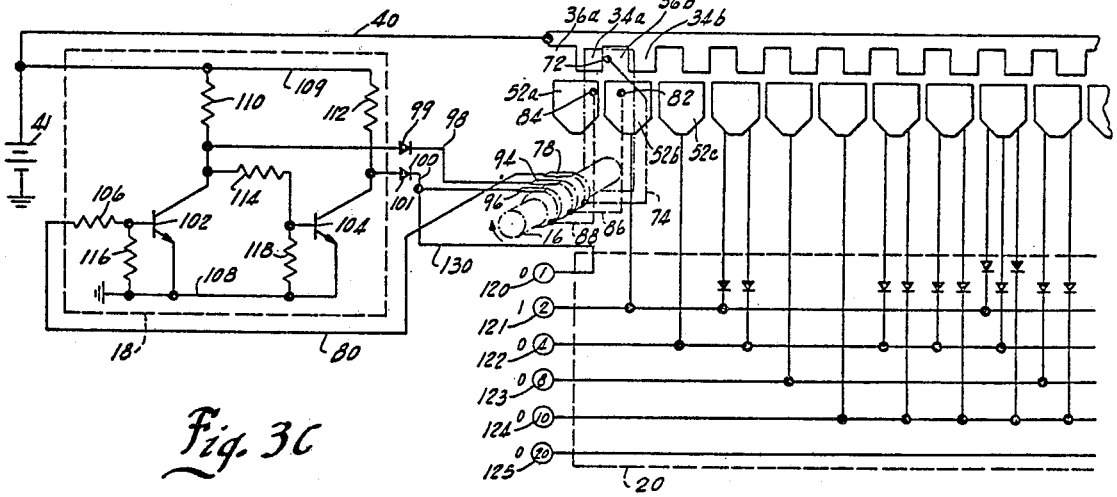
Figure 3D:
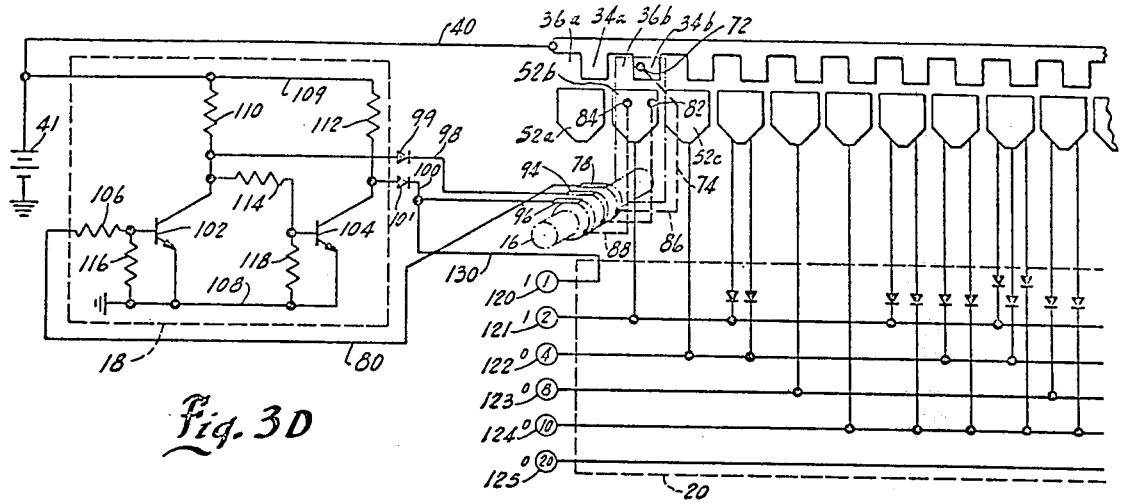
Figure 3E:
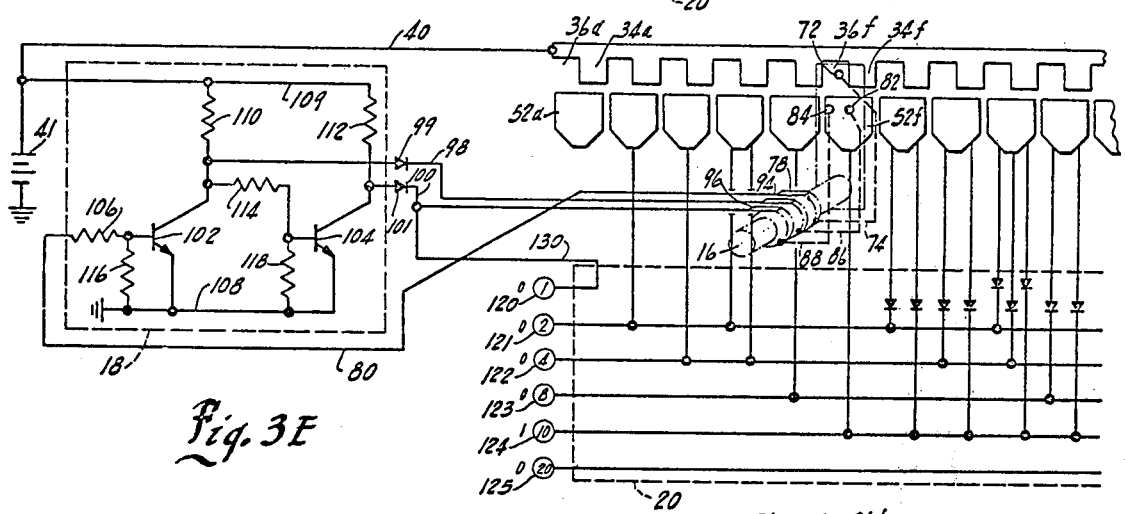

Referring now to FIG. 3a, the converting apparatus 10 of the present invention is shown in a condition in which the rotary position of the shaft is not altered and may be said to be in the reference rotary position of zero degrees. Under such conditions, brush 72 is in contact with non-conductive interelement space 36a and no signal is provided in conductor 80 to inverter 18.

The absence of an input signal in conductor 80 to the base of transistor 102 prevents that transistor from turning on so that an output signal is provided in conductor 98 from the lower end of resistor 110. A signal is provided to the base of transistor 104 from the collector of transistor 102 through resistor 114. This turns transistor 104 on, shorting the collector to common bus 108, and preventing the formation of an output signal in conductor 100. As conductor 100 is connected to output terminal 120 via conductor 130, no output signal appears at that terminal, as shown by the adjacent binary zero indication.

Lead brush 82, energized with the signal in conductor 98, and de-energized lag brush 84 connected to conductor 100 are applied to conductive segment 52a of position indicator track 50 which represents the two shaft positions of zero degrees and ten degrees. However, as none of the conductors of conductor and diode network 20 are connected to conductive segment 52a, no signals are generated at any of the additional output terminals 121 through 125. As there is no output signal appearing at any of the output terminals 120 through 125 as shown by the adjacent binary zero indications, the output of converting device 10 has a binary characteristic 000000 which corresponds to a shaft rotary position of zero degrees.

When the shaft of converting apparatus 10 is moved to an angle of ten degrees, brush 72 carried thereby will be moved onto conductive element 34a of track 32. See FIG. 3b. As conductive element 34a is energized by conductor 40, a signal now appears in brush 72 and conductor 80. This signal, when applied to the base of transistor 102 renders the transistor conductive, shorting the collector to common bus 108, removing the signal in conductor 98 and the signal to the base of transistor 104. Transistor 104 is turned off, generating a signal in conductor 100.

The energization of lead-lag brush pair 82, 84 is reversed in that lag brush 84 is energized by the signal in conductor 100 while lead brush 82 is de-energized by the loss of the signal in conductor 98. As brush 72 moves across conductive element 34a of track 32, energized lag brush 84 remains in engagement with conductive segment 52a even though deenergized lead brush 82 moves onto conductive segment 52b in preparation for applying a signal to that segment when brush 72 again moves into engagement with a non-conductive space, in this case, space 36b. Presently, however, lead brush 82 is de-energized and has no effect on the output signal of converting device 10.

The electric signal in conductor 100 is provided to output terminal 120 via conductor 130 as shown by the adjacent binary digit 1. As segment 52a is not connected to any of the output terminals and as lead brush 82 is de-energized, no other signals are provided to the output terminal of converting device 10 so that the output of converting device 10 has the binary characteristic 000001. This energization of the output terminals of the device is interpreted as the decimal equivalent 1.

When shaft 16 of converting device 10 is displaced to an angle of 20°, brush 72 moves onto non-conductive interelement space 36b. Lead brush 82 already on segment 52b becomes energized applying a signal to that segment. Lag brush 84 becomes deenergized through the operation of inverter 18 in a manner similar to that occurring when brush 72 was in contact with space 36a, as described above. By insuring that lead brush 82 is already on segment 52b prior to energization, possible loss of signals at the output terminals of device 10, due to insulating barriers 54 or for other reasons, is avoided and continuous non-ambiguous signal generation assured.

The signal at output terminal 120 reverts to the binary digit zero condition due to the loss of the signal in conductor 98. See FIG. 3c. Segment 52b, energized by the signal applied by lead brush 82, supplies a signal through conductor 132 and bus 134 to output terminal 121. Thus, the output of converting device 10 is comprised of the signal at output terminal 121 and the absence of a signal at all other output terminals so that the output binary characteristic is 000010. As output terminal 121 has a weighted decimal value of 2, this combination of the presence and absence of electrical signals at the output terminals is interpreted as the decimal equivalent 2.

When shaft 16 has been turned 30°, lag brush 84 and terminal 120 are re-energized as brush 72 moves onto conductive element 34b of track 32, and lead brush 82 is de-energized. See FIG. 3d. Lag brush 84 is moved into contact with segment 52b of position indicator track 50. This energization state and location of the lead and lag brushes on position indicator track 50 generates a signal at terminal 120 and at terminal 121 but no signals at the remaining output terminals so that the output of converting device 10 has the binary characteristic 000011. As electric signals appear at both output terminals 120 and 121, the weighted decimal values of 1 and 2 assigned to these terminals are added to provide a decimal equivalent of 3.

As shaft 16 is displaced to additional angular positions, the above described operation of converting device 10 is continued to provide a unique electric signal combination at the output terminals of device 10. In the manner described above, the weighted decimal values of the various signal combinations are totalled to ascertain the decimal equivalents.

When the shaft is displaced 100°, brush 72 will engage non-conductive interelement space 36f causing an electric signal to appear in lead brush 82 and the absence of an electric signal in lag brush 84. Lead brush 82 will be in engagement with segment 52f of position indicator track 50, which segment represents the two shaft positions of 100° and 110°. The signal in lead brush 82 energizes segment 52f and provides a signal to output terminal 124, via conductor 154 and bus 152. As conductor 154 is connected only to bus 152, no signals will appear at output terminals 120 through 123 and output terminal 125 so that the output of converting device 10 has the binary characteristic 010000 which corresponds to the decimal equivalent 10.

Additional alterations in the rotary position of the shaft causes further generation of output signals in the binary coded decimal form in a manner similar to that described above. Such output signals are continuously provided but change in characteristic at the beginning of each ten degree position interval.

OTHER EMBODIMENTS

Figure 4:
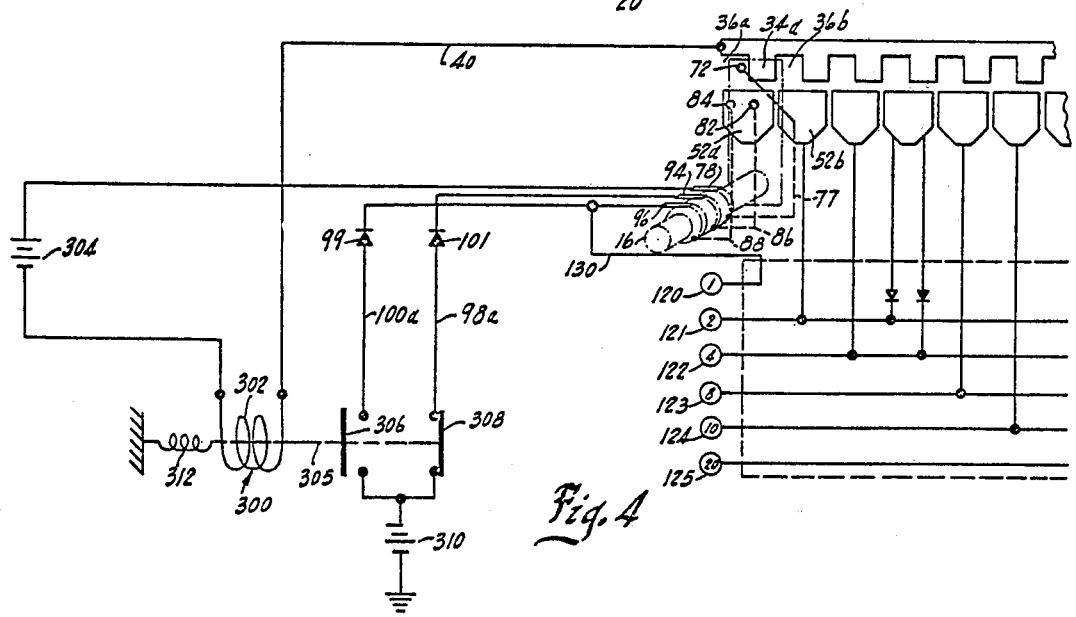
FIG. 4 is also a fragmentary schematic view showing a construction modification of the device shown in FIGS. 1 through 3.

It will be appreciated that other forms of the encoding apparatus of the present invention may be devised. For example, as shown in FIG. 4, an electromechanical device, such as a relay 300, may be employed in place of inverter 18 to alternately energize lead and lag brushes 82 and 84 as brush 72 moves across the conductive elements 34 and nonconductive interelement spaces 36 of track 32. Relay 300 has a relay coil 302 connected in series with battery 304. One end of the two components so connected is connected to conductor 80 and brush 72, while the other end is connected to conductor 40 and conductive elements 36 of track 32.

Relay 300 also includes a solenoid 305 movable by the energization of relay coil 302 to open and close a pair of relay contacts 306 and 308. The relay contacts are inserted in parallel conductors 98a and 100a connected between grounded battery 310 and lead and lag brushes 82 and 84, respectively. A spring 312, or other mechanical bias means, is connected to solenoid 305 to close relay contact 308 when brush 72 is in engagement with nonconductive spaces 36 and relay coil 302 is de-energized, so that lead brush 82 is energized by battery 310 while lag brush 84 is de-energized in the same manner as through the operation of inverter 18. When brush 72 moves onto a conductive element 34, the circuit of relay coil 302 is closed and relay 300 is energized to open switching contacts 308 and close contacts 306, energizing lag brush 84 and de-energizing lead brush 82 also in a manner similar to inverter 18.

FIG. 5 shows a converting device 10A in which the output varies as a function of the sine of the angular position of shaft 16. Portions of converting device 10A which correspond to those of converting device 10 are identified by similar numbers and only so much of converting device 10A as is necessary to differentiate its construction and operation from that of converting device 10 is shown in FIG. 5 and described herein.

The construction of encoding disc 12, brush assembly 14, and inverter 18, in converting device 10A is similar to that of converting device 10. As the resolution of function encoder 10A is half that of linear encoder 10, as described above, each of segments 52 in position indicator track 50 corresponds to an angular position of 20° rather than 10°.

Conductor and diode network 200 includes three sets of output terminals. The first set of terminals 202 provides an electric output having a decimal equivalent equal to the sine function of the angular position of the shaft. The second set of terminals 204 provides an electric output indicative of the quadrant in which the angular position of the shaft is located. The third set of output terminals 206, actually only a single terminal, provides an indication of the sign — positive or negative — of the sine of the angular position of shaft 16. Three sets of output terminals are required since from the standpoint of trigometry, it is necessary to describe the function magnitude, quadrant, and sign in order to completely define the sine function of a given shaft angular position.

The first set of output terminals 202 includes output terminals 210 through 234. The weighted decimal values assigned to output terminals 210 through 218 are .001, .002, .004, .008, and .01, respectively, which values form a first decade of output signals. The weighted decimal values assigned to output terminals 220 through 226 are .02, .04, .08, .1, respectively, which values form a second decade of output signals. The weighted decimal values assigned to output terminals 228 through 234 are .2, .4, .8, 1.0, respectively, which values form the third and last decade through which the sine function ranges in magnitude.

The second set of output terminals 204 includes output terminals 236 through 240 which are assigned the weighted decimal values 1, 2, and 4 so as to provide an indication of which of the four quadrants the angular position of shaft 16 is located.

Output terminal 206 provides an indication of a plus sine function when energized and a negative sine function when de-energized.

Sine function output terminals 210 through 234 are connected to sine function busses 250 through 274, respectively. Quadrant output terminals 236, 238, and 240 are connected to quadrant busses 251, 253, and 255, respectively, and sign output terminal 204 is connected to sign bus 257.

Segment 52a of position indicator track 50, indicating the zero angular position of shaft 16, is not connected to any of busses 250 through 274. However, the segment is connected to quadrant bus 251 and sign bus 257 by conductors 275 and 277, respectively. Conductors 275 and 277, as do the other conductors of network 200 described herein, contain the appropriate signal isolating diodes.

Segment 52b, indicating the first quadrant twenty degree position of shaft 16, is connected through conductors 276, 278, 280, and 282 to sine function busses 252, 262, 266, and 286, respectively. The segment is also connected through conductors 279 and 281 to quadrant bus 251 and sign bus 257, respectively. The segments 52 of position indicator track 50 indicating the 40°, 60° and 80° shaft positions are connected in an analogous manner to the necessary busses.

Segment 52f, indicating the second quadrant one hundred degree position of shaft 16, is connected via conductors 284, 286, 288, and 290 to sine function busses 254, 264, 266, and 272. The segment is also connected to quadrant bus 253 and to sign bus 257 by conductors 292 and 294, respectively.

Segment 52k, indicating the third quadrant two hundred degree position of shaft 16, is connected via conductors 296, 298, 300, and 302 to sine function busses 252, 262, 266, and 268. The segment is also connected to quadrant busses 251 and 253 by conductors 304 and 306, but is not connected to sign bus 257.

Segment 52r, indicating a fourth quadrant shaft position of 340 degrees, is connected through conductors 308, 310, 312, and 314 to sine function busses 252, 262, 266, and 268. The segment is also connected to quadrant bus 255 via conductor 316 but is not connected to sign bus 257.

In operation, when shaft 16 is at an angular position of zero degrees, and segment 52a is energized by lead-lag brush pair 82, 84, no signal is provided at sine function output terminal 202, due to the lack of conductors between the segment and the sine function busses. Thus, an output signal of zero is provided at the sine function output terminals 202 which corresponds to the sine of 0°. However, a signal is provided to bus 251 and quadrant output terminal 236, via conductor 275, and to sign output terminal 206, via conductor 277 and bus 257. The signal at quadrant output terminal 236 has a weighted decimal value of 1, indicating that the angular position of shaft 16 is in the first quadrant, while the signal present at output terminal 206 indicates that the sine function is positive rather than negative. The quadrant and sign signals at output terminals 236 and 206 serve to indicate that the angular position of shaft 16 is 0°, rather than 180°, the other shaft position of shaft 16 for which the sine function is zero.

When shaft 16 is moved to an angular position of twenty degrees, an electric signal is applied to segment 52b. This provides electric signals at sine function output terminals 212, 222, 226, and 228, via conductors 276, 278, 280, and 282 and busses 252, 262, 266, and 268. Adding the decimal values assigned to the aforementioned output terminals, the sum of .342, or the sine of 20° is obtained. The signal to bus 251 and quadrant output terminal 236 and to sign output terminal 206 via conductors 279 and 281, provides an indication that the shaft angular position is in the first quadrant and is positive, and that the sine function at terminal set 202 is thus that of 20° rather than of 70°, 200°, or 340°, the latter also being angular positions, the sine function of which is .342.

In an analogous manner, when shaft 16 is moved to an angular position of 100 degrees, a summed decimal signal equal to .984 or the sine of 100°, is obtained at sine function output terminal set 202 from the application of a signal to segment 52f of position indicator track 50. The signal to quadrant bus 253 and quadrant output terminal 238 in conductor 292 provides an indication that the shaft angular position is now in the second quadrant so that the angular position is correctly 100 degrees and not 80°, the latter angular position being in the first quadrant. In a similar manner, the signal to sign output terminal 206 in bus 257, from conductor 294, excludes the possibility that the shaft output position is 260° or 280°, as the sine function of both of these angles has negative characteristics.

When the angular position of shaft 16 is moved into the third quadrant, as for example, to a position of 200°, signals are provided at quadrant output terminals 236 and 238 from segment 52k so that by adding the decimal assigned to the output terminals, the sum of 3 is obtained which is indicative of the third quadrant. This output signal excludes the possibility that the sum of .342, obtained at sine function output terminal set 202 could be interpreted as the sine of 340°, the latter angle being in the fourth quadrant. Segment 52k is not connected to sign output terminal 206 so that the signal from sine function output terminal set 202 is taken as negative, exluding the possibility that the shaft is at angular positions of 20° or 70°.

When in the fourth quadrant, as when at a shaft angular position of 340°, a signal from the energized segment 52, in this case, segment 52r, is provided to quadrant bus 255 and quadrant output terminal 240, indicative of the fact that the shaft angular position is in the fourth quadrant. The absence of a signal at output terminal 206 also points to the fourth quadrant location of shaft 16. The appropriate sine function signal is provided to output terminal set 202 by the energization of segment 52r.

Figure 6:
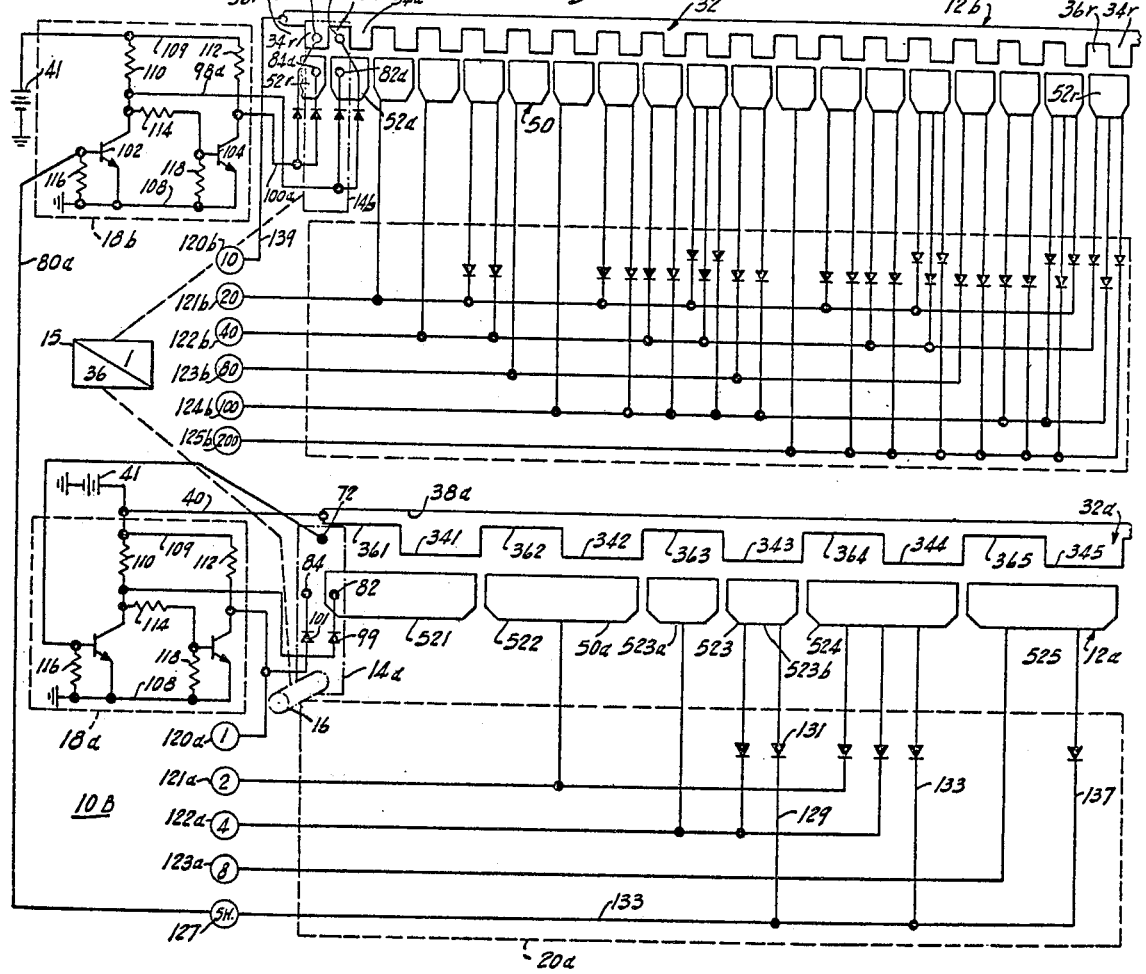
FIG. 6 is a schematic view of a converting device of the present invention in the same developed form utilized for FIG. 2 showing a device having a pair of cascaded elements.

Turning now to FIG. 6, there is shown therein a converting device 10B constructed in accordance with the present invention and having a pair of encoding discs. Plural disc converting devices are often used in high resolution multi-revolution encoders. For example, it may be desired to ascertain the position of an element by means of a converting device coupled to a lead screw mechanism used to move the element.

FIG. 6 shows a linear converting device which ascertains shaft positions in 36° intervals, that is, it provides ten unique output signals or counts during each revolution of shaft 16. Additionally, through its cascaded or decaded construction achieved by the utilization of a plurality of discs, the converting device registers the ten counts generated during each revolution and permits the generation of additional decades of ten counts during additional revolutions of shaft 16, up to a total of 36 revolutions and decades. A total of 360 counts may thus be generated.

The foregoing is accomplished by providing in converting device 10B a pair of encoding discs 12a and 12b, shown in developed linear form in FIG. 6. Encoding disc 12a contains a position indicator track 50a constructed in a manner similar to that of the position indicator tracks of the converting devices described above. Position indicator track 50a contains five segments, 521, 522, 523, 524, 525. The center position indicator segment 523 is split into two segments 523a and 523b to provide a switching function hereinafter described.

Second track 32a is formed of five conductive segments 341, 342, 343, 344 and 345 and five non-conductive interelement spaces 361, 362, 363, 364 and 365. Each element-space pair occupies the same linear or arcuate space as one of the segments 521 through 525 plus the adjacent insulating areas. The conductive elements are energized from battery 41 through conductors 40 and 38a.

Brush assembly 14a and inverter 18a are similar to brush assembly 14 and inverter 18 found in the previously described converting devices and operate in the same manner. These elements are shown in simplified form in FIG. 6.

Conductor and diode network 20a is similar to conductor and diode network 20. As disc 12a ascertains ten shaft positions, only four output terminals 120a, 121a, 122a, and 123a having weighted decimal values of 1, 2, 4, and 8 are required. An additional output terminal 127 is provided in network 20a. This output terminal provides a continuous output signal during the last five shaft positions sensed by the cooperation of brush assembly 14a with position indicator track 50a.

Second disc 12b is identical to encoding disc 12 found in converting device 10. Position indicator track 50 has eighteen segments 52a through 52r. Track 32 has eighteen conductive element — nonconductive interelement space pairs. However, the conductive elements are not energized by a power source, but rather by the cooperating brush assembly as hereinafter described.

Brush assembly 14b which engages the tracks on encoding disc 12b is coupled to brush assembly 14a and shaft 16 through a 36 to 1 reduction gear 15 so that for every 36 revolutions of shaft 16 and brush assembly 14a, brush assembly 14b revolves once. Brush assembly 14b contains two lead-lag brush pairs. Lead-lag brush pair 82a, 84a engage the segments 52 of position indicator track 50 while lead-lag brush pair 82b, 84b engage the elements 34 and inter-element spaces 36 of track 32. The lead-lag brush pairs are connected in parallel through isolating diodes and are connected to inverter 18b by conductors 98a and 100a. Inverter 18b is similar to inverters 18 and 18a with the exception that the input is connected to output terminal 127 of conductor and diode network 20a by conductor 80a so that the state of the mutually exclusive output signal of inverter 18b is controlled by the signal existing at that terminal.

Conductor and diode network 20b is similar to conductor and diode network 20 with the exception that output terminal 120b is connected to conductor 38 of track 32 and energized therefrom by conductor 139. Output terminals 120b, 121b, 122b, 123b, 124b, and 125b are assigned the weighted decimal values of 10, 20, 40, 80, 100 and 200, respectively.

In operation, encoding disc 12a and brush assembly 14a cooperate to provide output signals at output terminals 120a through 123a having weighted decimal values ranging from zero to nine. When brush assembly 14a reaches position indicator track segment 523b, half way through its revolution around track 50a, and applies a signal thereto, a signal is also supplied to output terminal 127 through conductor 129, diode 131, and bus 133. The need for providing a signal to output terminal 127 at the end of half a revolution of brush assembly 14a necessitates the division of position indicator segment 523 into two portions. It will be appreciated that in many applications, as for example when one-half the total number of counts generated per revolution is an even number, the splitting of the center segment will not be necessary. For all remaining positions of shaft 16, subsequent to the half revolution position, a signal is provided to output terminal 127, as through conductors 135 and 137 connected to segments 524 and 525, respectively, and to bus 133.

For each revolution of brush assembly 14a along the tracks of encoding disc 12a, brush assembly 14b moves 1/36th of a revolution along encoding disc 12b. During the initial portion of such movement. The absence of a signal in conductor 80a causes inverter 18b to energize lead brushes 82a and 82b. Assuming brush assembly 14a is in its first revolution, lead brush 82b is in contact with nonconductive interelement space 36a and lead brush 82b is in contact with position indicator track segment 52a and no signals are provided at any of output terminals 120b through 125b.

When brush assembly 14a completes half a revolution along encoding disc 12a, gearing 15 will have driven brush assembly 14b so that lead brush 82b engages conductive element 34a while lag brush 84b engages nonconductive interelement space 36a. Both lead brush 82a and and lag brush 84a engage position indicator segment track 52a. A signal is provided in conductor 80a to inverter 18b which energizes lag brushes 84a and 84b and de-energizes lead brushes 82a and 82b. However, as lag brush 84b is in contact with interelement space 36a, no output signal is provided at output terminal 120b. Similarly no output signal is provided at any of the output terminals 121b through 125b, due to the lack of conductors between segment 52a and the output terminals.

When brush assembly 14b completes one revolution around the tracks of encoding device 12a, gear 15 will have driven brush assembly 14b so that lead brush 82b is in engagement with conductive element 34a. When brush assembly 14a commences its second revolution around the tracks of encoding disc 12a, the signal in conductor 80a to inverter 18b is removed, energizing lead brush 82b and providing a signal in conductor 139 to output terminal 120b. As noted supra, the presence of a signal at output terminal 120b is interpreted as the decimal value 10, indicative of the fact that brush assembly 14a has completed one revolution around the tracks of encoding disc 12a and generated ten output signals.

The operation of converting device 10b continues in an analogous manner to register each revolution of brush assembly 14a at output terminals 120b through 125b up to 36 revolutions or 360 counts.

It will be appreciated that additional discs and cooperating brush structures may be incorporated in converting device 10b in the manner described above and shown in FIG. 6 to further increase the count of the converting device.

From the foregoing it will be apparent that other modifications and embodiments of converting device 10 may be made, if desired.

I claim:

1. In an analog to digital converter for representing the angular position of a shaft as the potential condition of a plurality of output terminals, the combination of, a stationary disc having only first and second coaxial rings of segments thereon, said first ring having pairs of alternately arranged conductive and nonconductive segments and said second ring having spaced conductive position indicator segments, a first brush member operatively connected to said shaft and being rotatable relative to said stationary disc and carrying a sensing brush adapted to engage said segments of said first ring and a pair of leading and lagging brushes positioned to engage said position indicator segments of said second ring, a plurality of output terminals of different ordinal significance, the presence of a potential on each of said output terminals being assigned a weighted decimal value and the number of said output terminals being less than the number of said position indicator segments, means coupled to said sensing brush for applying a potential to said leading and lagging brushes when said sensing brush engages a nonconductive and a conductive segment in said first ring respectively, and means including a plurality of circuits for coupling said position indicator segments to said output terminals for transforming the analog quantities represented by the potentials with which said leading and lagging brushes energize said position indicator segments in the decimal sequence 0, 1, 2, 3, 4, 5, etc. into binary coded digital signals on said output terminals the sum of whose weighted value is a function of said sequence and of the angle of rotation of said first brush member and the shaft coupled thereto relative to said first stationary disc, certain of said circuits coupling individual ones of said position indicator segments to a plurality of said output terminals, and means for applying said potential to and removing it from the output terminal of least ordinal significance when said sensing brush engages a conductive and nonconductive segment respectively of said first ring, the second, third, and fifth position indicator segments being individually coupled to the second, third and fourth output terminals respectively and the fourth position indicator segment being coupled to said second and third output terminals.

2. In an analog to digital converter for representing the angular position of a shaft as the potential condition of a plurality of output terminals, the combination of, a stationary disc having only first and second coaxial rings of segments thereon, said first ring having pairs of alternately arranged conductive and nonconductive segments and said second ring having spaced conductive position indicator segments, a first brush member operatively connected to said shaft and being rotatable relative to said stationary disc and carrying a sensing brush adapted to engage said segments of said first ring and a pair of leading and lagging brushes positioned to engage said position indicator segments of said second ring, a plurality of output terminals of different ordinal significance, the presence of a potential on each of said output terminals being assigned a weighted decimal value and the number of said output terminals being less than the number of said position indicator segments, means coupled to said sensing brush for applying a potential to said leading and lagging brushes when said sensing brush engages a nonconductive and a conductive segment in said first ring respectively, and means including a plurality of circuits for coupling said position indicator segments to said output terminals for transforming the analog quantities represented by the potentials with which said leading and lagging brushes energize said position indicator segments in the decimal sequence 0, 1, 2, 3, 4, 5, etc. into binary coded decimal digital signals on said output terminals the sum of whose weighted value is a function of said sequence and of the angle of rotation of said first brush member and the shaft coupled thereto relative to said first stationary disc, certain of said circuits coupling individual ones of said position indicator segments to a plurality of said output terminals, and means for applying said potential to and removing it from the output terminals of least ordinal significance when said sensing brush engages a conductive and a nonconductive segment respectively of said first ring, the second, third and fifth position indicator segments in said second ring being individually coupled to the second, third and fourth output terminals respectively and the fourth position indicator segment in said second ring being coupled to said second and third output terminals, and the sixth, seventh, eighth, ninth and tenth position indicator segments being coupled to the fifth output terminal.

* * * * *